(12) United States Patent
Yasui et al.

(10) Patent No.: US 8,679,915 B2
(45) Date of Patent: Mar. 25, 2014

(54) NON-VOLATILE SEMICONDUCTOR DEVICE AND METHOD OF FABRICATING EMBEDDED NON-VOLATILE SEMICONDUCTOR MEMORY DEVICE WITH SIDEWALL GATE

(71) Applicant: Renesas Electronics Corporation, Kawasaki (JP)

(72) Inventors: Kan Yasui, Kodaira (JP); Digh Hisamoto, Kokubunji (JP); Tetsuya Ishimaru, Kokubunji (JP); Shin-ichiro Kimura, Kunitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/671,482

(22) Filed: Nov. 7, 2012

(65) Prior Publication Data

US 2013/0065368 A1    Mar. 14, 2013

Related U.S. Application Data

(60) Continuation of application No. 12/652,517, filed on Jan. 5, 2010, now Pat. No. 8,324,092, and a division of application No. 11/452,256, filed on Jun. 14, 2006, now Pat. No. 7,667,259.

(30) Foreign Application Priority Data

Jun. 20, 2005    (JP) ................................ 2005-178871

(51) Int. Cl.
H01L 21/00    (2006.01)

(52) U.S. Cl.
USPC ............................ 438/257; 438/258; 438/267

(58) Field of Classification Search
USPC .......................................... 438/257, 258, 267
See application file for complete search history.

(56) References Cited

U.S. PATENT DOCUMENTS

| 5,585,293 | A | 12/1996 | Sharma et al. |
| 5,883,418 | A | 3/1999 | Kimura |

(Continued)

FOREIGN PATENT DOCUMENTS

| JP | 5-48113 | 2/1993 |
| JP | 5-121700 | 5/1993 |

OTHER PUBLICATIONS

S. Kianian et al., "A Novel 3 Volts-Only, Small Sector Erase, High Density Flash E²PROM," 1994 Symposium on VLSI Technology Digest of Technical Papers, 1994, pp. 71-72.

(Continued)

*Primary Examiner* — Laura Menz
(74) *Attorney, Agent, or Firm* — Miles & Stockbridge P.C.

(57) ABSTRACT

A method of manufacturing a non-volatile semiconductor memory device is provided which overcomes a problem of penetration of implanted ions due to the difference of an optimal gate height in simultaneous formation of a self-align split gate type memory cell utilizing a side wall structure and a scaled MOS transistor. A select gate electrode to form a side wall in a memory area is formed to be higher than that of the gate electrode in a logic area so that the height of the side wall gate electrode of the self-align split gate memory cell is greater than that of the gate electrode in the logic area. Height reduction for the gate electrode is performed in the logic area before gate electrode formation.

4 Claims, 18 Drawing Sheets

(56) References Cited

U.S. PATENT DOCUMENTS

| | | | |
|---|---|---|---|
| 6,063,675 A | 5/2000 | Rodder | |
| 6,063,677 A | 5/2000 | Rodder et al. | |
| 6,124,627 A | 9/2000 | Rodder et al. | |
| 6,127,233 A | 10/2000 | Rodder | |
| 6,177,318 B1 * | 1/2001 | Ogura et al. | 438/267 |
| 6,187,641 B1 | 2/2001 | Rodder et al. | |
| 6,246,091 B1 | 6/2001 | Rodder | |
| 6,649,471 B2 | 11/2003 | Cho et al. | |
| 6,785,165 B2 * | 8/2004 | Kawahara et al. | 365/185.28 |
| 6,972,997 B2 | 12/2005 | Ishimaru et al. | |
| 7,045,848 B2 * | 5/2006 | Shukuri | 257/311 |
| 7,067,373 B2 | 6/2006 | Shukuri | |
| 7,115,943 B2 * | 10/2006 | Mine et al. | 257/324 |
| 7,130,223 B2 | 10/2006 | Ishimaru et al. | |
| 7,132,718 B2 | 11/2006 | Hisamoto et al. | |
| 7,235,441 B2 | 6/2007 | Yasui et al. | |
| 7,326,616 B2 | 2/2008 | Shukuri | |
| 7,366,015 B2 | 4/2008 | Kobayashi et al. | |
| 7,442,986 B2 | 10/2008 | Yasui et al. | |
| 7,504,689 B2 * | 3/2009 | Hisamoto et al. | 257/324 |
| 7,525,145 B2 | 4/2009 | Shukuri | |
| 7,544,988 B2 | 6/2009 | Shukuri | |
| 7,667,259 B2 * | 2/2010 | Yasui et al. | 257/314 |
| 7,671,404 B2 | 3/2010 | Hisamoto et al. | |
| 7,687,845 B2 | 3/2010 | Arigane et al. | |
| 7,709,315 B2 | 5/2010 | Tega et al. | |
| 7,811,891 B2 | 10/2010 | Orlowski et al. | |
| 7,847,343 B2 * | 12/2010 | Hisamoto et al. | 257/324 |
| 7,863,131 B2 * | 1/2011 | Yasui et al. | 438/257 |
| 7,915,666 B2 * | 3/2011 | Yasui et al. | 257/324 |
| 8,063,433 B2 * | 11/2011 | Ishimaru et al. | 257/324 |
| 8,084,810 B2 | 12/2011 | Hisamoto et al. | |
| 8,143,663 B2 | 3/2012 | Jeong | |
| 8,143,668 B2 | 3/2012 | Morita et al. | |
| 8,324,092 B2 * | 12/2012 | Yasui et al. | 438/593 |
| 2003/0022442 A1 | 1/2003 | Cho et al. | |
| 2004/0155234 A1 | 8/2004 | Ishimaru et al. | |
| 2004/0185617 A1 * | 9/2004 | Shukuri | 438/257 |
| 2005/0085039 A1 | 4/2005 | Yasui et al. | |
| 2005/0199940 A1 * | 9/2005 | Mine et al. | 257/315 |
| 2005/0230736 A1 | 10/2005 | Ishimaru et al. | |
| 2006/0008992 A1 * | 1/2006 | Shukuri | 438/264 |
| 2006/0022260 A1 * | 2/2006 | Hisamoto et al. | 257/324 |
| 2006/0035435 A1 * | 2/2006 | Yasui et al. | 438/299 |
| 2006/0203543 A1 | 9/2006 | Jeong | |
| 2006/0220100 A1 * | 10/2006 | Tanaka et al. | 257/315 |
| 2006/0234454 A1 * | 10/2006 | Yasui et al. | 438/267 |
| 2007/0040208 A1 | 2/2007 | Hisamoto et al. | |
| 2007/0145455 A1 * | 6/2007 | Yasui et al. | 257/314 |
| 2007/0155103 A1 * | 7/2007 | Shukuri | 438/267 |
| 2007/0195596 A1 | 8/2007 | Kobayashi et al. | |
| 2007/0207581 A1 * | 9/2007 | Yasui et al. | 438/257 |
| 2008/0048249 A1 | 2/2008 | Tega et al. | |
| 2008/0142876 A1 | 6/2008 | Arigane et al. | |
| 2008/0265286 A1 * | 10/2008 | Ishimaru et al. | 257/214 |
| 2008/0290401 A1 * | 11/2008 | Yasui et al. | 257/324 |
| 2009/0050956 A1 * | 2/2009 | Ishimaru et al. | 257/324 |
| 2009/0078985 A1 * | 3/2009 | Shukuri | 257/316 |
| 2009/0090948 A1 * | 4/2009 | Sato | 257/296 |
| 2009/0096036 A1 | 4/2009 | Ishigaki et al. | |
| 2009/0152619 A1 | 6/2009 | Hisamoto et al. | |
| 2009/0231921 A1 | 9/2009 | Kimura et al. | |
| 2010/0105199 A1 * | 4/2010 | Yasui et al. | 438/593 |
| 2010/0157689 A1 * | 6/2010 | Tanaka et al. | 365/185.23 |
| 2010/0289120 A1 * | 11/2010 | Sato | 257/534 |
| 2012/0061774 A1 | 3/2012 | Morita et al. | |
| 2013/0065368 A1 * | 3/2013 | Yasui et al. | 438/257 |
| 2013/0082315 A1 * | 4/2013 | Hosoda et al. | 257/315 |
| 2013/0126960 A1 * | 5/2013 | Chakihara et al. | 257/324 |
| 2013/0235668 A1 * | 9/2013 | Tanaka et al. | 365/185.17 |

OTHER PUBLICATIONS

W. Chen et al., "A Novel Flash Memory Device with SPlit Gate Source Side Injection and ONO Charge Storage Stack (SPIN)," 1997 Symposium on VLSI Technology Digest of Technical Papers, 1997, pp. 63-64.

* cited by examiner

|  | Vmg | Vs | Vcg | Vd | Vsub |
|---|---|---|---|---|---|
| READ [V] | 1.5 | 0 | 1.5 | 1 | 0 |
| WRITE [V] | 12 | 5 | 1.5 | 1 | 0 |
| ERASE [V] | -5 | 7 | 0 | OPEN | 0 |

NON-VOLATILE SEMICONDUCTOR DEVICE AND METHOD OF FABRICATING EMBEDDED NON-VOLATILE SEMICONDUCTOR MEMORY DEVICE WITH SIDEWALL GATE

The present application claims priority from Japanese application JP 2005-178871, filed on Jun. 20, 2005, the content of which is hereby incorporated by reference into this application.

BACKGROUND OF THE INVENTION

1. Field of the Invention

The present invention relates to a non-volatile semiconductor memory device and a manufacturing method thereof. In particular, this non-volatile semiconductor memory device is extremely useful to be embedded on a same semiconductor substrate with logic circuits which function is typically represented by a microcomputer.

2. Description of the Related Art

Semiconductor devices of upgraded performance can be developed by embedding non-volatile semiconductor memory cells in logic semiconductor devices on a silicon substrate. They have been widely utilized as embedded microcomputers for industrial machines, home electric appliances, on-vehicle equipment, etc. Generally, programs required for the microcomputers are stored in embedded non-volatile memories and optionally read out for use.

The cell structure of the non-volatile memory suitable for embedding within the logic semiconductor device described above includes a split gate type memory cell comprising a select MOS transistor and a memory MOS transistor. This is suitable for embedded use because of the following: Since a source side injection (SSI) with satisfactory injection efficiency can be adopted in this structure, the programming speed can be increased and the power supply area can be reduced. In addition, since memory cell select transistors and transistors connected therewith can be composed of low voltage transistors with small occupied areas, the area for the peripheral circuit can be reduced. Literatures relevant to those include, for example, JP-A Nos. 5-48113 (hereinafter referred to as Patent Document 1) and 5-121700 (hereinafter referred to as Patent Document 2), IEEE, Symposium on VLST Technology, Proceedings, pp 71 to 72, (hereinafter referred to as Non-Patent Document 1) and IEEE, 1997, Symposium on VLSI Technology, Proceedings, pp 63 to 64 (hereinafter referred to as Non-Patent Document 2).

The charge retention of the memory MOS transistor includes a floating gate type in which charges are stored in electrically isolated conductive polysilicon (Patent document 2, Non-Patent Document 1) and an MONOS type in which charges are stored in a dielectric film having a property of trapping charges such as a silicon nitride film (Patent document 1, and Non-Patent Document 2). The floating gate has been widely used for a program storing flash memory in mobile phones or a data storing large capacity flash memory and shows good charge retention characteristics. However, along with device scaling, it has become difficult to ensure a capacitive coupling ratio necessary for the potential control of the floating gate and the structure has been complicated. To suppress the leakage of the retained charges, an oxide film that surrounds the floating gate needs to have a thickness of about 8 nm or more, approaching the limit of device scaling intended for high speed operation and high integration. The charge retention is deteriorated extremely when even only one defect is present as a leakage path in an oxide film on the periphery of the floating gate.

On the other hand, the MONOS is generally poor compared with the floating gate in view of the charge retention characteristics, and the threshold voltage approaches a lower value as the logarithm of the time. Accordingly, while the MONOS has been known through the ages, it has yet been put to practical use only for some products. However, since this is a discrete trapping memory of storing charges in dielectrics, several leak paths, if any, do not lead to loss of entire retention charges and this is resistant to oxide film defects. Accordingly, this system has advantageous features that it is suitable for device scaling since even a thin oxide film of 8 nm or less can be used, the reliability is easily predictable since the retention is not lowered extremely due to defects with low probability, and the memory structure is simple to be embedded easily in logic circuits. With such view points, the MONOS has been again attracted attention in recent years along with the device scaling.

A split gate structure particularly suitable for device scaling includes a structure of forming one of MOS transistors with a side wall by self-alignment (Patent Document 1, Non-Patent Document 2). In this case, since an alignment margin in photolithography is not necessary and the gate length of a transistor formed by self-alignment can be less than the minimum resolution size of photolithography, a finer memory cell compared with the existent structure of forming each of the two transistors by a photomask can be attained.

Among the split gate type memory cells utilizing the self-alignment, the memory cell with self-align MONOS structure is suitable for embedding within a high speed logic circuit area, which is shown in the Patent-Document 3 and Non-Patent Document 2. FIG. 1 shows a typical cross sectional view of this memory cell. A memory gate 11 and a select gate 12 are formed above a semiconductor substrate 60. In the illustrated structure, the memory gate 11 is formed of an ONO film comprising a $SiO_2$ film 13, an $Si_3N_4$ film 14, and an $SiO_2$ film 15 (hereinafter the multi-layered film thus formed is referred to as an ONO film) and a polysilicon electrode of the side wall structure on the side wall of a select gate 12. A cobalt silicide layer 16 is formed above diffusion areas 1, 5, the select gate 12, and the memory gate 11.

In the memory cell described above, since the select gate 12 is formed previously in view of the structure, the select gate 12 and a gate oxide film of a logic circuit area formed simultaneously therewith can be formed in a state where the quality of the silicon substrate interface is good. Since a transistor having a thin film gate at a high speed operation and sensitive to interface quality can be formed previously, the performance of the logic circuit area and the select gate transistor is improved. Since the stored information can be read only by the operation of the transistor with high performance select gate transistor and all of transistors connected therewith can be constituted with a thin film low voltage transistors, reading speed can be increased and the circuit area can be reduced. In FIG. 1, only the memory area in the semiconductor memory device is illustrated and the logic circuit area is not shown.

The manufacturing process of a split gate MONOS memory cell has a feature of well matching with the standard CMOS process and it is suitable for a microcomputer or the like in which a non-volatile memory is embedded. This is to be described referring to an example of a manufacturing step for a memory area together with a logic circuit area together in a semiconductor memory device, in conjunction with difficulties involved therein. FIGS. 2 to 10 show production process flows in parallel with the CMOS logic process. In each of the figures, the left-hand part shows the cross section of a memory area and the right-hand part shows a cross section of a logic area to form CMOS. FIG. 2 shows a step of forming a gate dielectric film 6 and a gate electrode material 34 comprising polysilicon above a silicon substrate 60. The gate dielectric film 6 is used in common with the select transistor of the MONOS memory area and a transistor of a logic area. While not illustrated, a device isolation structure is formed using a usual method as a pre-stage in the manufacturing step for specific products. Successively, a gate electrode structure 12 of the memory area is formed by photolithography and dry etching (FIG. 3). Successively, an ONO film 18 comprising a $SiO_2$ film 13, $Si_3N_4$ film 14, and a $SiO_2$ film 15 is deposited (FIG. 4). Further, doped amorphous silicon is deposited as a second electrode material for forming a memory gate electrode material. Then, the amorphous silicon film is etched back by dry etching to leave an amorphous silicon film as side walls 11, 40 only on the side wall of the gate electrode (FIG. 5). From the side walls 11, 40 thus formed, one unnecessary side 40 of the memory gate is removed by dry etching and, further, the ONO film in the lower layer after removal of the side wall electrode is also removed. Further, impurity-doped areas 1, 5 with low concentration are formed (FIG. 6).

Then, as shown in FIG. 7, a gate electrode structure 17 in the logic area is formed by using photolithography and dry etching. From this state, a $SiO_2$ film 19 is deposited as the side wall for both of the transistors in the MONOS memory cell and the logic area and then etched back. Then, a heavily doped region 18 with high concentration is formed (FIG. 8). To lower the resistance of the gate electrodes 12, 17 and the diffusion region 18, silicidation 27 is applied with cobalt (FIG. 9). Then, a first layer dielectric film 42 is deposited (FIG. 10) and planarization and contact area formation are performed. Subsequently, a standard process of metallization for about 3- to 6-layers is applied, but the description therefore is to be omitted.

In the self-align split gate type MONOS memory explained in the order of the manufacturing steps described above, the height of the memory gate electrode 11 is lower compared with the select gate electrode 16 in view of the structure forming the memory gate electrode 11 with the side wall. This produces a problem with the device scaling in the production rule.

FIG. 11 is a cross sectional view for explaining manufacturing process according to the 150-nm rule as the related art. FIG. 11 shows a main portion in FIG. 1 in which identical portions carry the same reference numerals. In accordance with the 150-nm rule, the height of the select gate electrode 12 is about 250 nm. On the other hand, the memory gate electrode 11 to be formed is slanted at the upper surface due to the side all structure. Accordingly, the lowest portion above the channel is from 200 nm to 150 nm. On the other hand, FIG. 12 shows a cross section in a case of manufacture according to the 90-nm rule. FIG. 12 also shows identical portions as those in FIG. 11. As illustrated in the drawing, the height of the select gate electrode 12 is reduced to about 150 nm. Accordingly, the height of the memory gate electrode 11 can be ensured only by about 100 nm to 50 nm at the lowest portion above the channel.

In a case where the height of the memory gate electrode 11 is not sufficient, implanted ions 49 can not be completely blocked by the gate electrode 11 as a mask upon ion implantation 49 for forming the diffusion region on the side of the channel by self-alignment, and the ions are implanted into the channel to cause a problem with the fluctuation of the threshold voltage. As a specific example, it is considered such a case in which the gate electrode 11 comprises polysilicon and phosphorous are implanted under the implantation condition under 40 keV and at $1\times10^{13}$ atoms/$cm^2$ as ion implantation for the diffusion region. Among a plurality times of the ion implantation steps, the most penetrating condition is extracted. When the projected range Rp of the ion implantation and the standard deviation σ (ΔRp) are trial-calculated, they are: σ=60 nm and σ=25 nm respectively (the values are approximated in the case of amorphous silicon). The distance necessary for decreasing the amount of implanted ions to such a level as giving no effects on the threshold voltage of the channel is about 135 nm (Rp+3×σ=135 nm). That is, this means that at least 135 nm height is necessary for the upper end of the gate electrode. In a case of the 150-nm rule shown in FIG. 11, since the height of the memory gate electrode is from 200 nm to 150 nm, there is no problem. On the other hand, in a case of the device scaling to the 90-nm rule shown in FIG. 20, since the height of the memory gate electrode is only about 100 nm to 50 nm and it is lower than 135 nm described above, a problem arises with penetration of the implanted ions into the channel portion. Curves 80 in FIGS. 11 and 12 are curves showing the distribution of the implanted ions 49 in the direction of the depth. There are shown a projected range Rp of the implantation ions, the standard deviation σ thereof, and the concentration Conc. In the example of FIG. 11, since the height of the memory gate electrode is higher than the projected range 3σ of the implanted ions, the problem does not arise with penetration of the implanted ions to the channel area. On the other hand, in the example of FIG. 12, since the height of the gate electrode is lower than the projected range 3σ of the implanted ions, a problem arises with penetration of the implanted ions to the channel area. This is shown by reference 50 in the drawing.

It is conceivable that countermeasures for the penetration of the implanted ions simply include (1) a method of increasing the height of the gate electrode and (2) a method of decreasing the energy for implantation. However, in the method (1) described above, the thickness of the photoresist film is reduced for the change of a KrF light source to the ArF light source, or for higher accuracy also in the KrF light source. Accordingly, the removing amount is restricted in the dry etching using the photoresist film as a mask, which makes it difficult to further increase the film thickness for the gate electrode material. Also in the method (2) described above, the ion implantation condition is determined in view of the requirement for countermeasure of the short circuit failure between the diffusion region-substrate upon silicidation. Accordingly, such change is difficult so long as necessary silicide is applied irrespective of the scaling.

SUMMARY OF THE INVENTION

The present invention intends to solve such problems and provide a method of attaining the device scaling of a self-align split gate type memory cell.

The problem described above is attributable to that the height of the side wall 11 is always lower than the height of adjacent structure used for the formation thereof. The problem can be solved by forming the side wall in a state where the adjacent structure used for forming the side wall has a sufficient height. On the other hand, a process for forming the gate structure using a thin photoresist film is necessary for facilitating the device scaling in order to form the logic area. The invention is to be described specifically.

For the sake of simplicity, it is assumed that the height of the gate electrode capable of preventing penetration of the implanted ions is A (A>Rp+3×σ (ΔRp)), the maximum height of the gate capable of using a thin photoresist film for a fine pattern under an applied design rule is B, and the height of the side wall structure lowered from the adjacent structure is C. Symbols B and C are shown in FIG. 12 for reference. In the case of the 150-nm design rule, since B is sufficiently high, the height (B−C) of the side wall is greater than A, that is, they are in the relation: (B−C)>A, giving no problems. In a case of the device scaling to the 90-nm design rule, since B decreases with A and C being constant, are the relation, (B−C)<A, is established as illustrated in FIG. 2, causing a problem with penetration of the implanted ions.

Accordingly, as a countermeasure, the gate electrode films is deposited previously in common between the memory area and the logic area so that the height is equal to a value of (A+C) or greater. In this state, the select gate electrode structure in the memory area is formed. Successively, a treatment of decreasing the height of the gate electrode film to B or less may be added only in the logic area.

By the use of the means described above, since the height of the select gate is equal to a value of (A+C) or greater, it is ensured that the height of the side wall electrode can be equal to A (that is, (A+C−C=A) or greater. Accordingly, penetration of implanted ions will not occur. On the other hand, since the height of the gate electrode film in the logic area is B or less, it can be formed by using a thin photoresist film for fine pattern.

A key process is the treatment for decreasing the height of the gate electrode film in the logic area. The height of the gate electrode film can be decreased at a good controllability by plurality of methods such as, for example, a method of previously using a multilayer structure of a conductive film and a dielectric film, or a method of using a multilayer structure of a conductive film and a conductive film. Accordingly, details are to be described with reference to the following preferred embodiments. Further, also the treatment of decreasing the height of the select gate electrode and the sequence for forming each of the gate electrodes include a plurality of technical options, and possible combinations and effects are to be described later.

The structure and the manufacturing method according to the invention can overcome the problems of penetration of implanted ions due to the difference for the optimal gate height which is caused upon embedding the self-align split gate type memory utilizing the side wall structure within the scaled MOS transistors. As a result, a gate electrode structure optimized for the memory cell and the gate electrode structure optimized for the improved performance of the CMOS logic area can be manufactured simultaneously on a single substrate. This can provide high performance and high-functional non-volatile memory embedded logic devices.

DESCRIPTION OF THE ACCOMPANYING DRAWINGS

PREFERRED EMBODIMENTS OF THE INVENTION

First Embodiment

Figure 1:
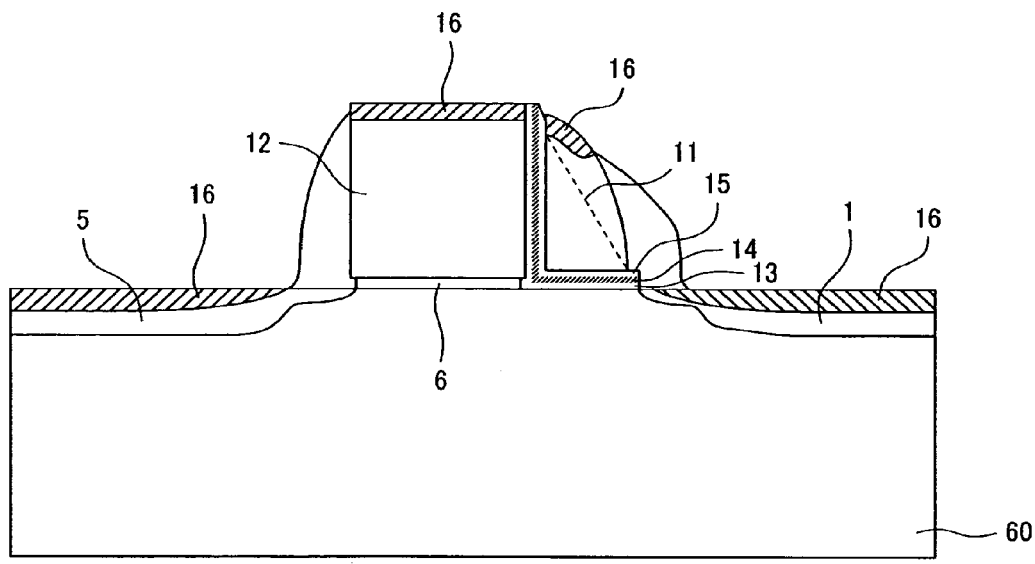
FIG. 1 is a cross sectional view of a self-align split gate MONOS memory cell.
Figure 2:
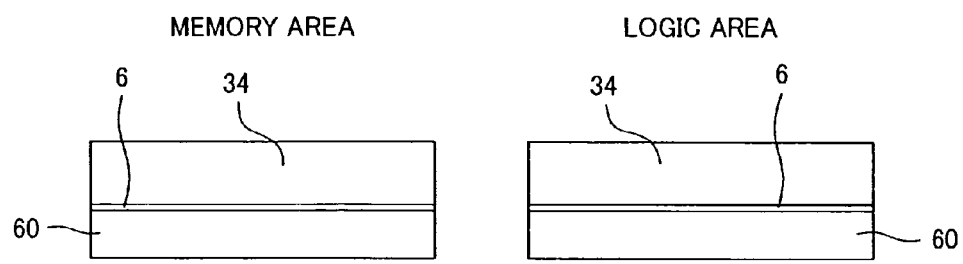
FIG. 2 is a cross sectional view of a device illustrated in the order of manufacturing steps of an existent self-align split gate MONOS memory cell.
Figure 3:
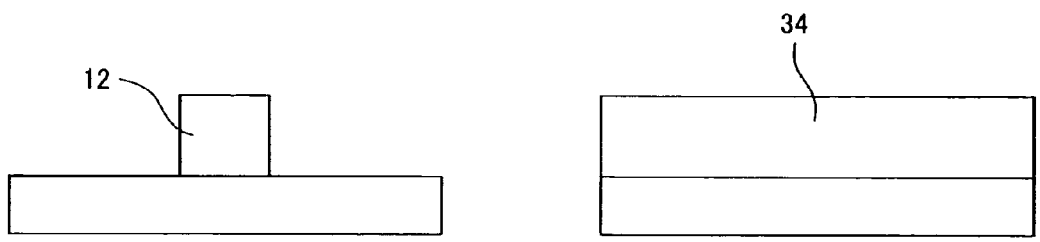
FIG. 3 is a cross sectional view of a device illustrated in the order of manufacturing steps of an existent self-align split gate MONOS memory cell.
Figure 4:
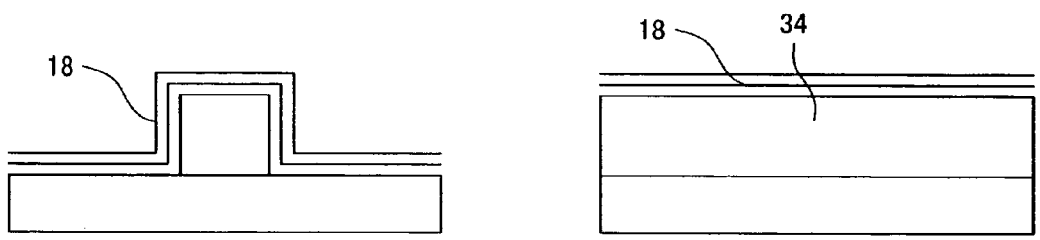
FIG. 4 is a cross sectional view of a device illustrated in the order of manufacturing steps of an existent self-align split gate MONOS memory cell.
Figure 5:
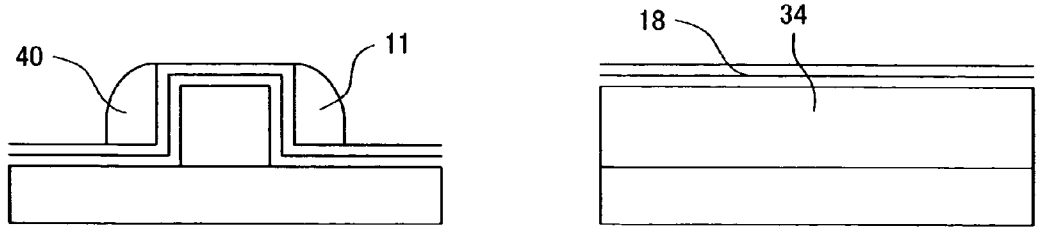
FIG. 5 is a cross sectional view of a device illustrated in the order of manufacturing steps of an existent self-align split gate MONOS memory cell.
Figure 6:
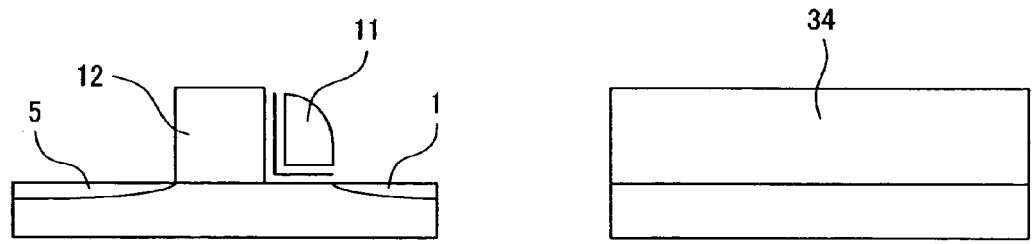
FIG. 6 is a cross sectional view of a device illustrated in the order of manufacturing steps of an existent self-align split gate MONOS memory cell.
Figure 7:
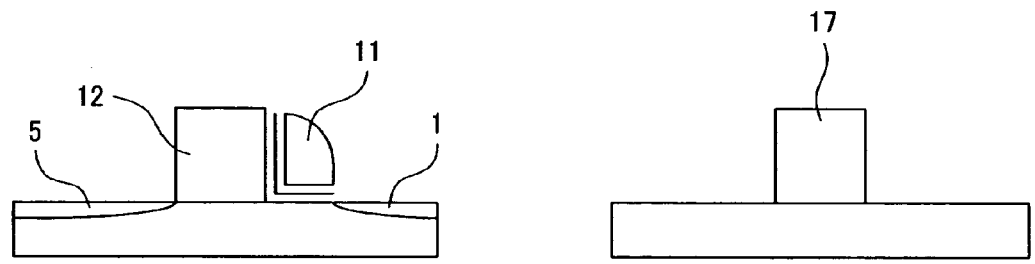
FIG. 7 is a cross sectional view of a device illustrated in the order of manufacturing steps of an existent self-align split gate MONOS memory cell.
Figure 8:
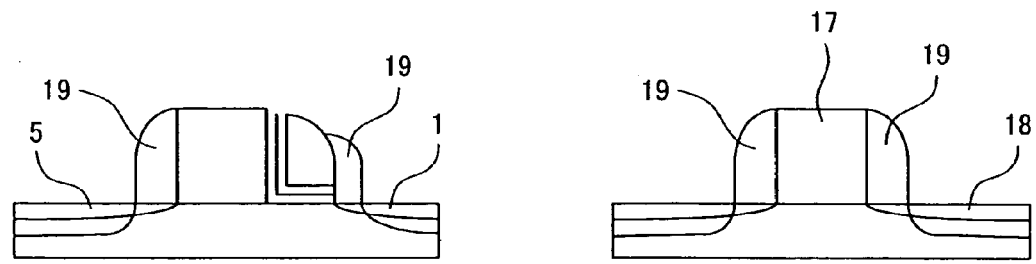
FIG. 8 is a cross sectional view of a device illustrated in the order of manufacturing steps of an existent self-align split gate MONOS memory cell.
Figure 9:
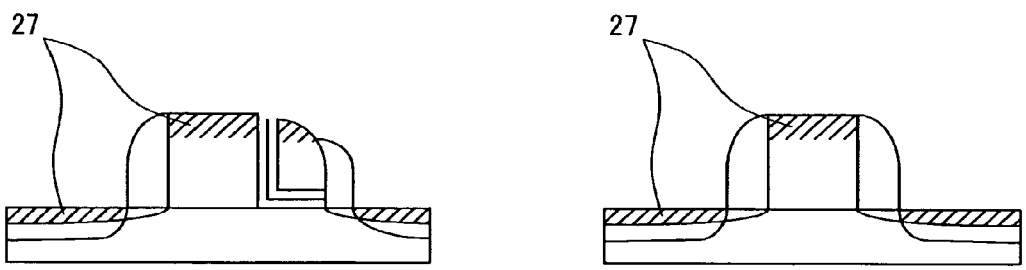
FIG. 9 is a cross sectional view of a device illustrated in the order of manufacturing steps of an existent self-align split gate MONOS memory cell.
Figure 10:
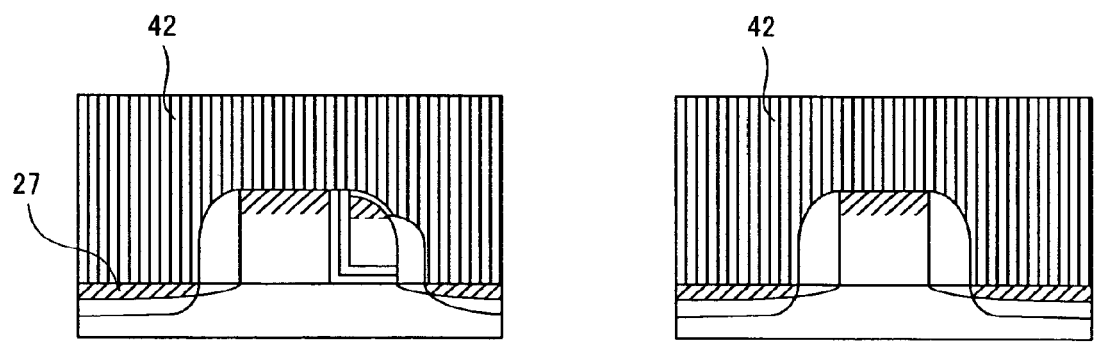
FIG. 10 is a cross sectional view of a device illustrated in the order of manufacturing steps of an existent self-align split gate MONOS memory cell.
Figure 11:
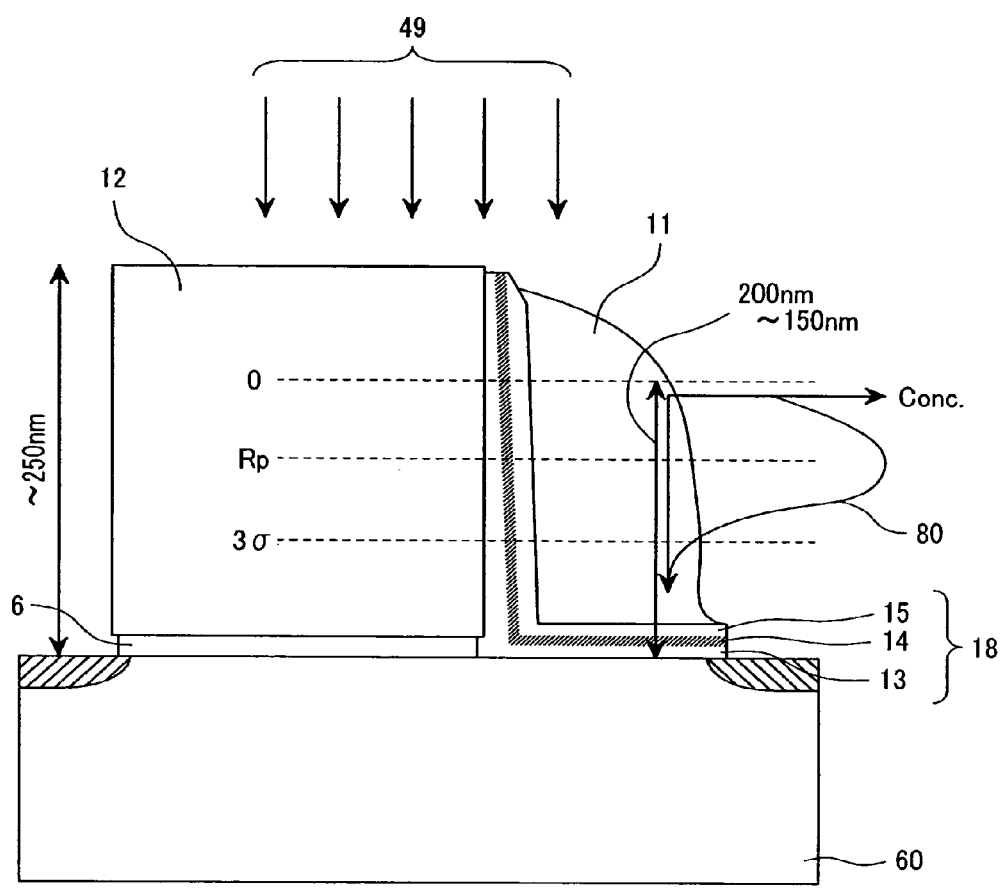
FIG. 11 illustrates a masking effect of implanted ions in a 150-nm design rule.
Figure 12:
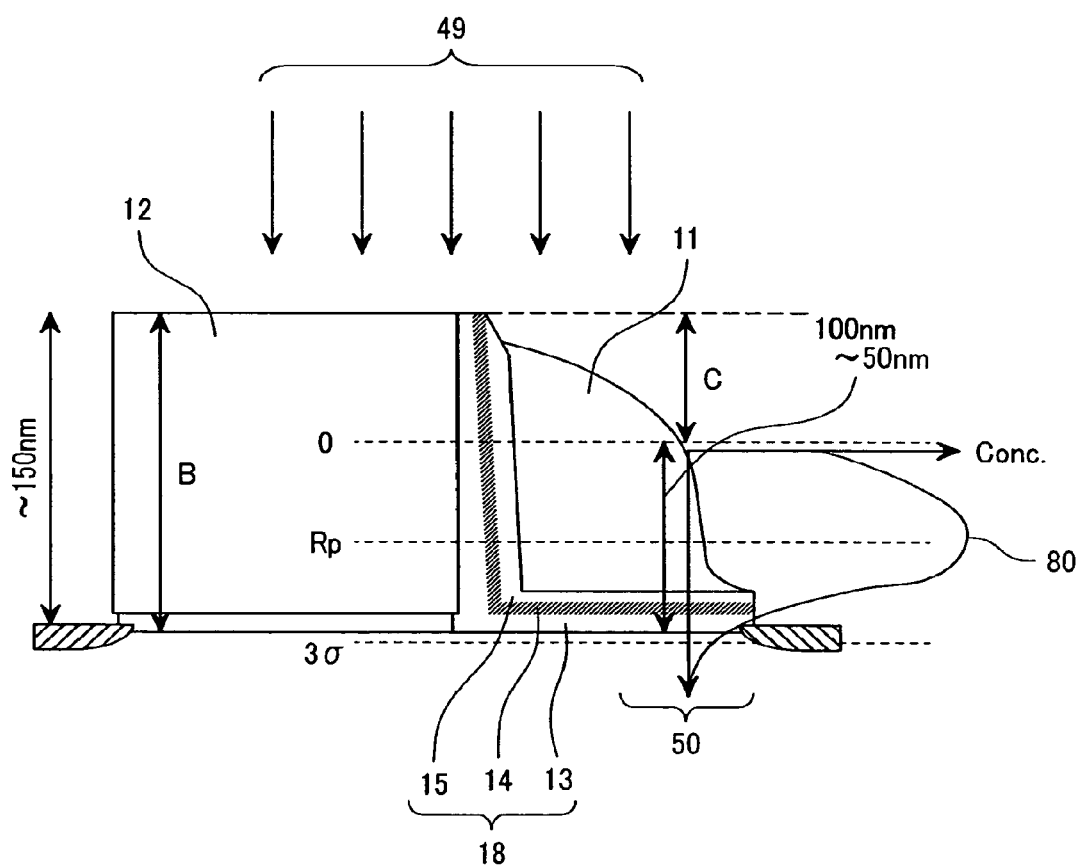
FIG. 12 illustrates a masking effect of implanted ions in a 90-nm design rule.
Figure 13:
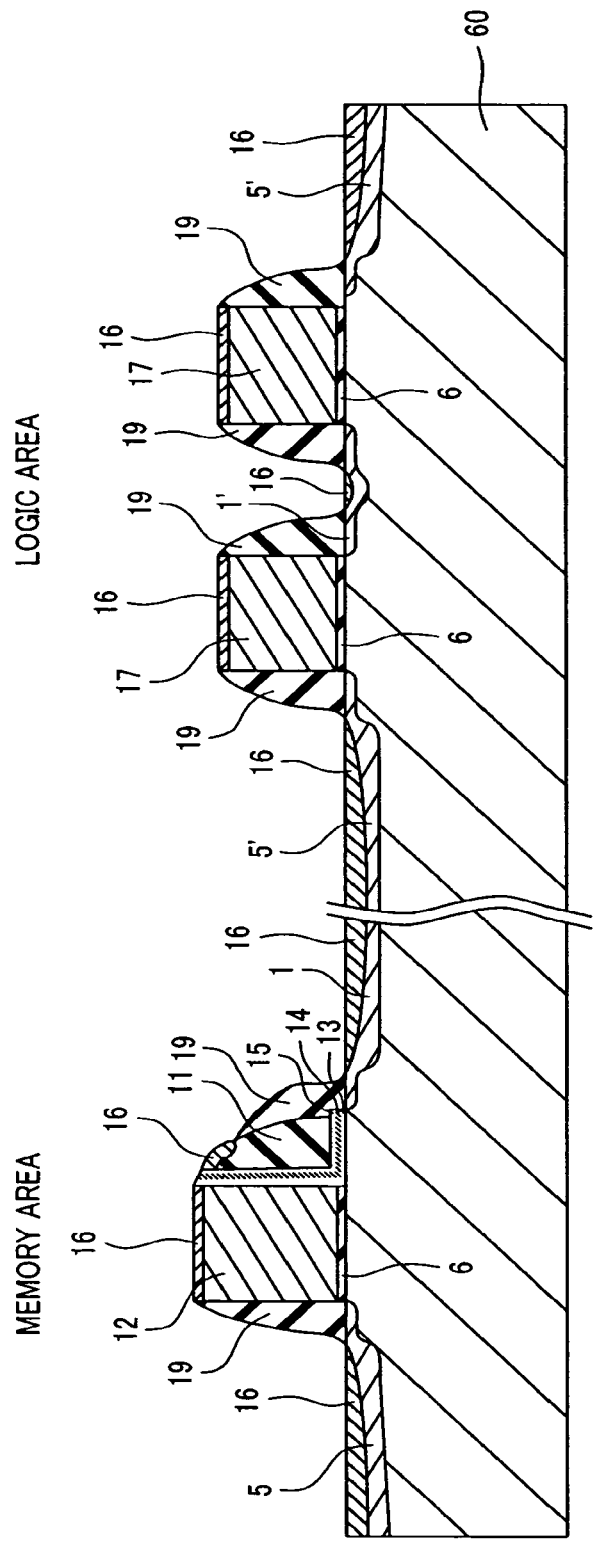
FIG. 13 is a cross sectional view illustrating a main portion of a semiconductor memory device having a self-align split gate MONOS memory cell according to the invention.
Figure 14:
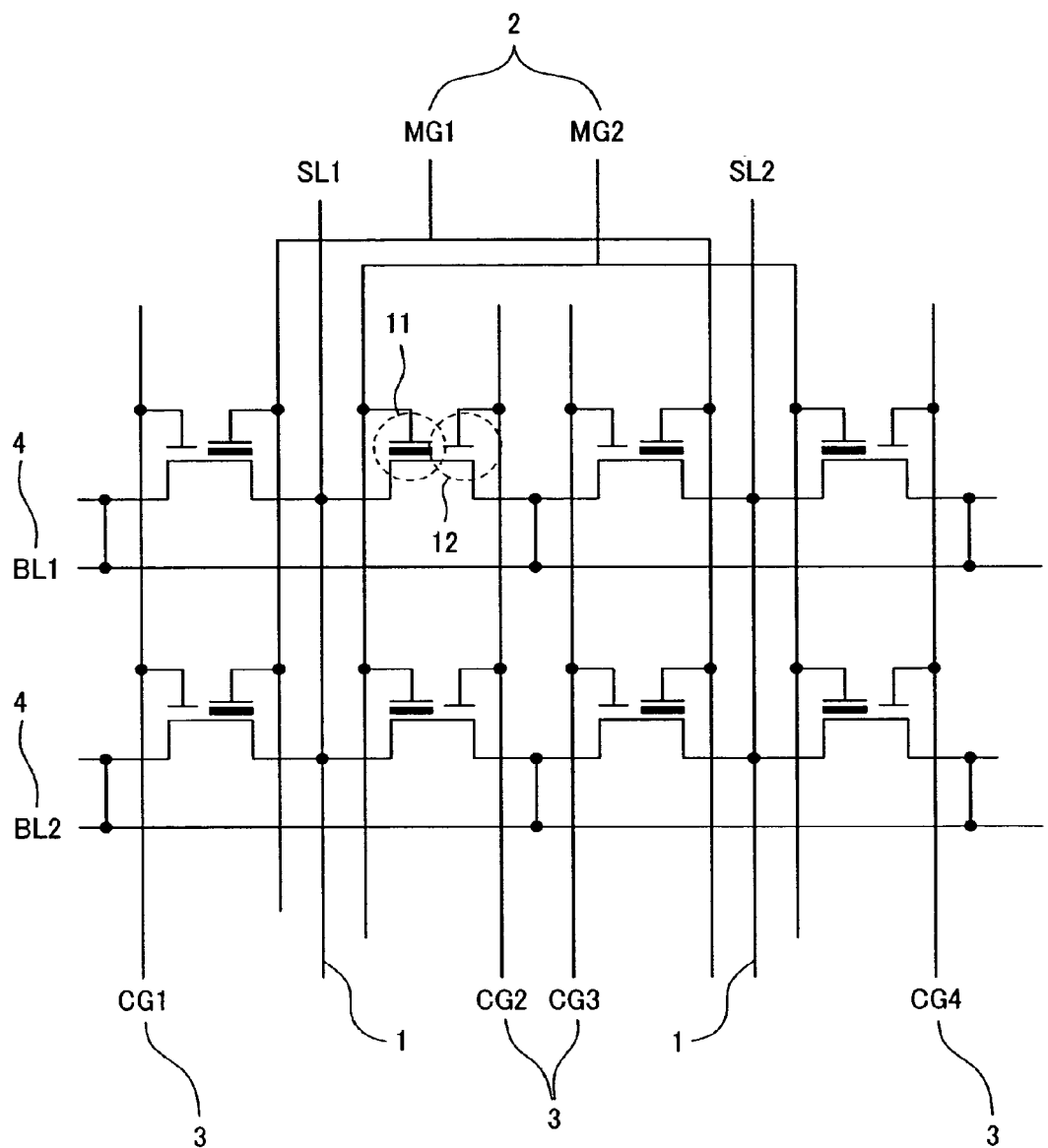
FIG. 14 is a schematic of a memory array by way of example.
Figure 15:
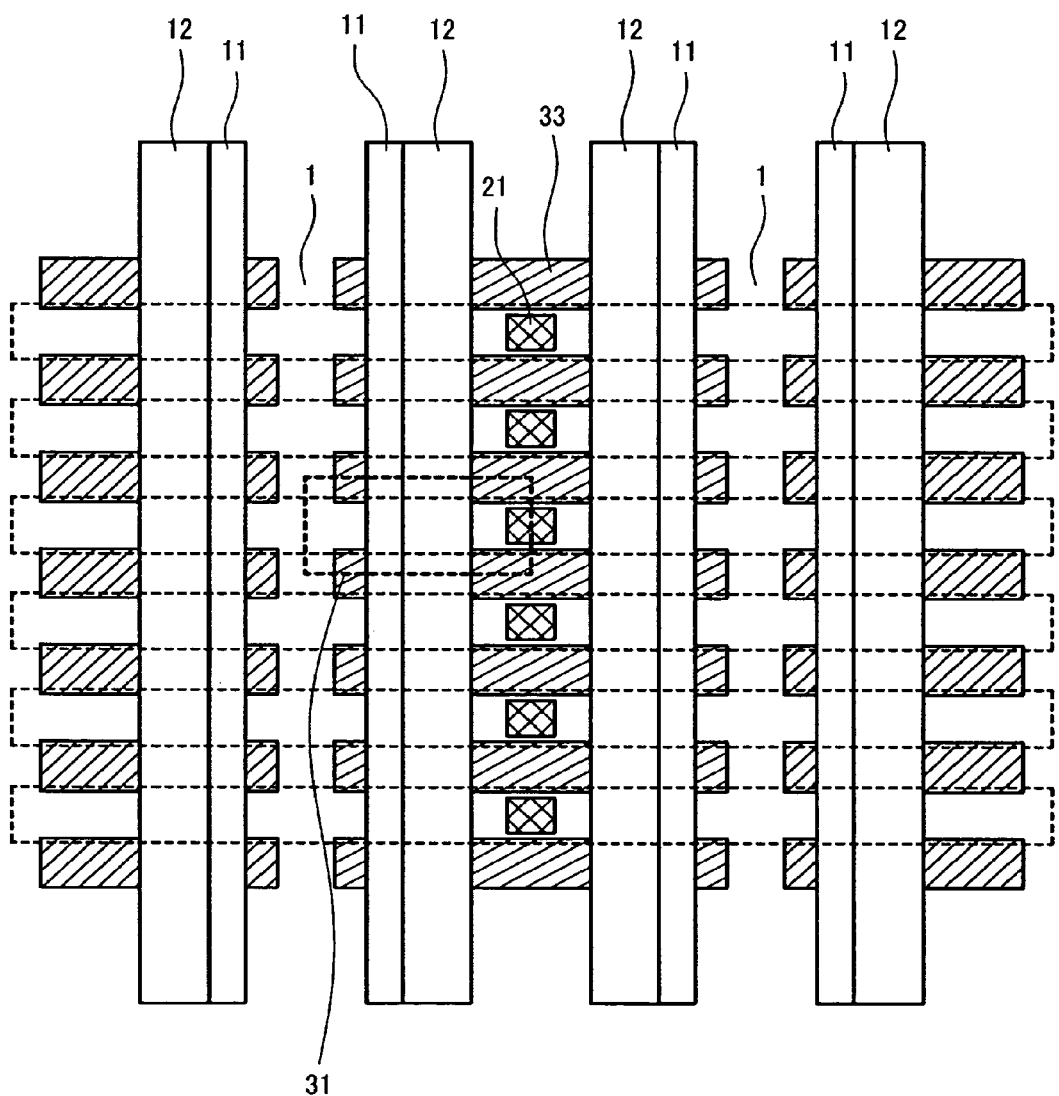
FIG. 15 is a layout of a memory array of a self-align split gate MONOS memory cell.

A first embodiment is to be described. The embodiment is an example of stacking two polysilicon layers and controlling the height of a gate electrode in a memory area and a logic area by using the same. FIG. 13 shows a cross sectional view for a basic structure of this embodiment. The array diagram of split gate MONOS memory is as shown in FIG. 14 and the array layout thereof are as shown in FIG. 15. A portion surrounded with a dotted line as a reference 31 in FIG. 15 corresponds to a unit memory cell. An adjacent memory cell is formed such that a select gate and a memory gate are always symmetrical. Conditions in FIG. 16 are adopted as the voltage for reading (Read), writing (Write) and erasing (Erase).

An example of an array diagram using split gate MONOS memory cells is to be described with reference to FIG. 14. The array constitution itself is the same as the usual structure. Each of the cells and a memory cell opposite thereto share a diffusion region (hereinafter referred to as a source) adjacent with a memory gate 11 and a source line 1 extends parallel with a word line. Two kinds of word lines, the memory gate 2 and the select gate 3, extend parallel to the direction of the word line. A bit line 4 perpendicular to them is connected to a diffusion region (hereinafter referred to as a drain) adjacent with the select gate 12 for each of the cells.

FIG. 15 shows the array constitution as a plane layout. The unit memory cell corresponds to an area surrounded by the dotted line 31 in the drawing and is electrically insulated from adjacent cells by a device isolation portion 33. The areas denoted with references 11 and 12 correspond to a memory gate 11 and a select gate 12, respectively. An area denoted with reference 1 corresponds to a source diffusion region.

Figures 16, 17:
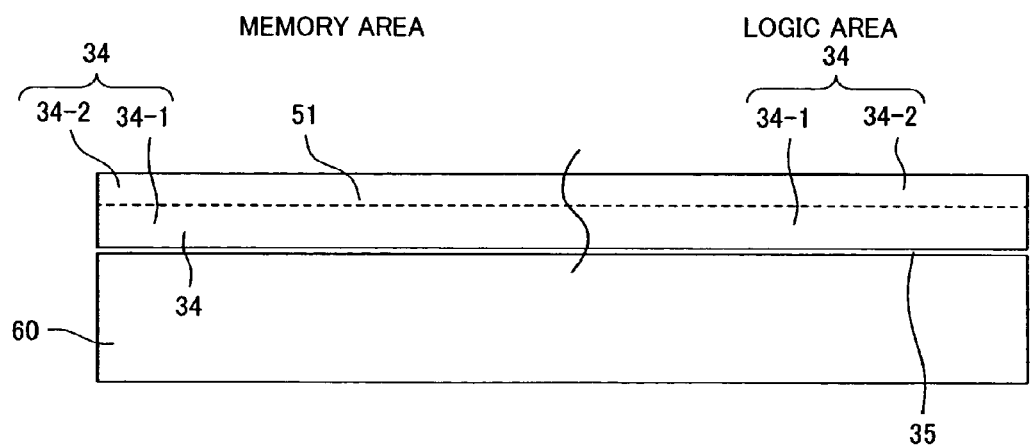
FIG. 16 is a diagram showing a list of typical operation conditions.
FIG. 17 is a cross sectional view of a semiconductor memory device of a first embodiment illustrating a main portion thereof in the order of manufacturing steps.

Then, FIG. 16 shows typical voltage conditions during operations. Relation for each of the voltages per se regarding the operation is the same as that in the usual case. Voltages are shown as Read for reading, Write for writing and Erase for erasing and, further, Vmg as a memory gate voltage, Vs as a source voltage, Vcg as a select gate voltage, Vd as a drain voltage, and Vsub as a substrate voltage. In the writing, according to the source side injection system (SSI system), the select gate 12 is weakly inverted in a state of applying about 12 V and 5 V to the memory gate 11 and the source 1 respectively, and hot electrons are generated by a strong electric field formed between the select gate 12 and memory gate 11 to inject them to the memory gate 11. In the erasing, a hot hole injection system by band-to-band tunneling (BTBT) is used. A voltage as an inverted bias is applied at about −5 V to the memory gate 11 and at about 7 V to the source 1, hot holes are generated by the band-to-band tunneling with a strong electric field formed at the end of the diffusion region to inject them into the memory gate 11. Upon reading of the written information, 1.5 V is applied both to the memory gate 11 and the select gate 12, and 1 V is applied to the drain 5 and this is judged depending on the level of a current flowing through the drain.

The cross sectional view for the main portion of the device, the array constitution, the cell layout, the voltage relation during operation, etc. explained in this section basically hold true for the other embodiments.

Then, a manufacturing method of this embodiment is to be described. A process rule of 90 nm node is used for manufacture. FIGS. 17 to 22 are cross sectional views of the device shown in the order of the manufacturing steps. In each of the drawings, the left-hand part is a memory area and the right-hand part is a logic area. This is illustrated in FIG. 17, which holds true of the other drawings in which no particular indications are shown.

Figure 18:
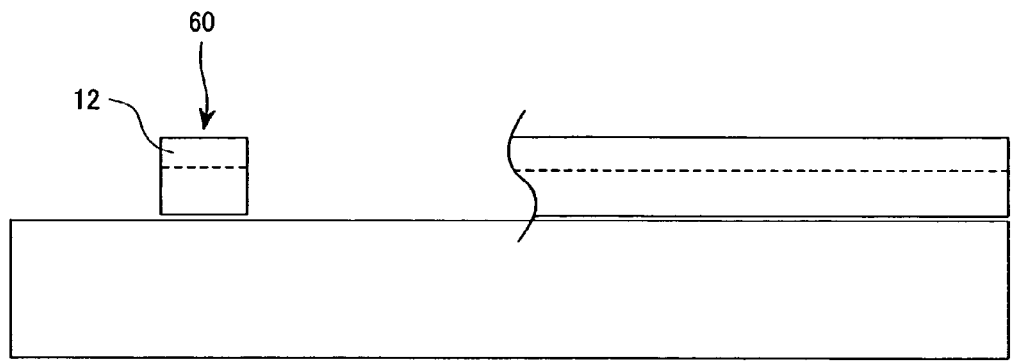
FIG. 18 is a cross sectional view of the semiconductor memory device of the first embodiment illustrating the main portion thereof in the order of manufacturing steps.
Figure 19:
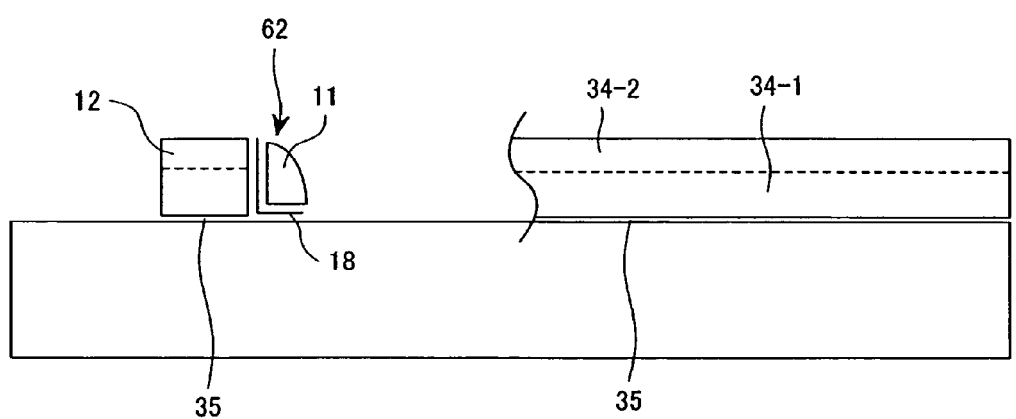
FIG. 19 is a cross sectional view of the semiconductor memory device of the first embodiment illustrating the main portion thereof in the order of manufacturing steps.

A thermal oxidation film 35 of 2 nm in thickness is grown as a gate dielectric film common to a select transistor in a memory area and a transistor in a logic area at 800° C. Successively, a polysilicon film 34 as a gate electrode is deposited at first to 150 nm for the first layer (34-1) and, successively, deposited to 100 nm as the second layer (34-2) to make the total film thickness to 250 nm (FIG. 17). Between the film deposition processes for the polysilicon films of the first layer and the second layer, the wafer is exposed to atmospheric air or an oxygen atmosphere to form a native oxide film 51 of several Å in thickness. In the drawing, the native oxide film is shown by a dotted line. Further, the polysilicon film is formed at a film forming temperature of 640° C. without doping. Then, a first gate electrode pattern 61 is formed only for the gate electrode film in the memory area using photolithography and dry etching (FIG. 18). In this case, the height of the gate electrode 61 is as high as 250 nm. Accordingly, a combination of a photoresist as a mask for dry etching having a thickness capable of corresponding thereto and photolithography using a KrF light source is used. Accordingly, the dimension of the select gate is set to 120 nm which is larger than the minimum dimension according to the 90 nm rule. Successively, an ONO film 18 comprising three layers of $SiO_2$ film/$Si_3N_4$ film/$SiO_2$ film (4 nm/10 nm/6 nm) is deposited as a charge trapping film. In the drawing for explaining the manufacturing method, the ONO film 18 is illustrated simply. Further, a doped amorphous silicon film is deposited to 90 nm thickness as a memory gate electrode. When the amorphous silicon film etched back by anisotropic dry etching and the surplus ONO film 18 is removed by dry and wet etching leaving only the side wall gate electrode 11, a basic memory cell structure is completed (FIG. 19).

Figure 20:
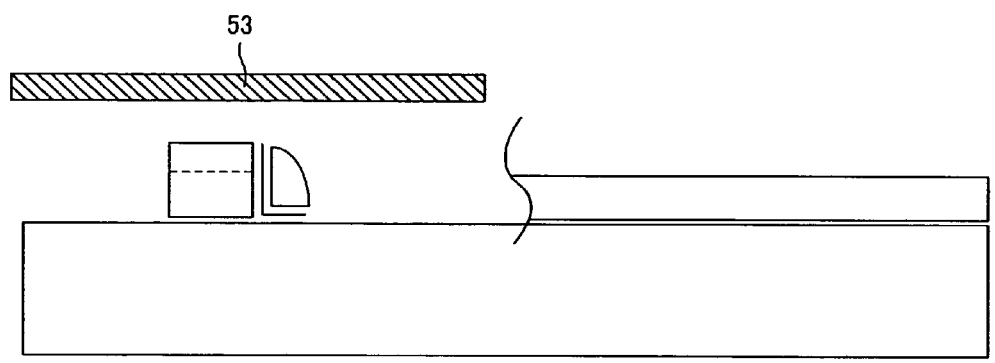
FIG. 20 is a cross sectional view of the semiconductor memory device of the first embodiment illustrating the main portion thereof in the order of manufacturing steps.

Successively, a treatment for decreasing the height of the gate electrode film was conducted by using photolithography and dry etching only for the gate electrode film 34 in the logic area. In this case, the memory cell area is covered by a photoresist film 53 and only the polysilicon layer (34-2) with 100 nm thickness in the upper portion of the multilayer structure is removed by selective dry etching of the polysilicon layer 34 (FIG. 20). Since the selectivity between the polysilicon layer and the oxide film in the dry etching is sufficiently high, the native oxide film 35 formed between the first layer and the second layer can be used as an etching stopper. Accordingly, the treatment for decreasing the height can be conducted with good uniformity within a wafer. Further, since the native oxide film 35 is electrically thin enough, it does not hinder the operation of applying the voltage to the gate electrode.

Figure 21:
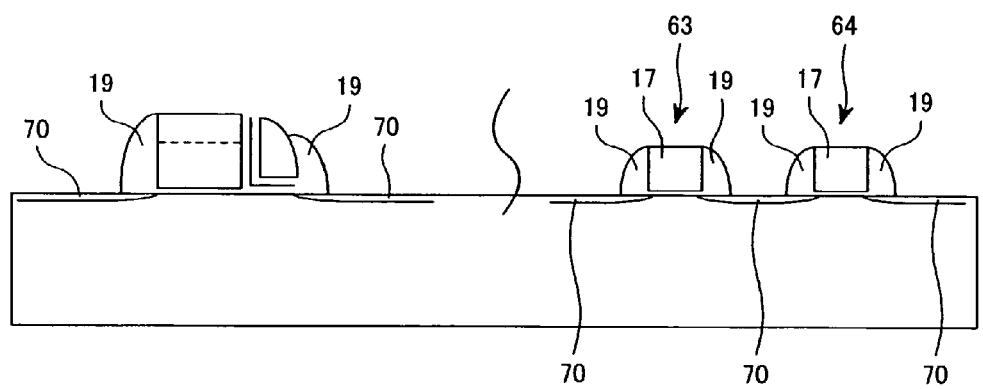
FIG. 21 is a cross sectional view of the semiconductor memory device of the first embodiment illustrating the main portion thereof in the order of manufacturing steps.

Then, gate electrode patterns 63 and 64 in the logic area are formed. In the previous step, the height B of the gate electrode film is decreased to 150 nm. Accordingly, the gate electrodes 63 and 64 for a high performance transistor with a gate length of 85 nm can be formed by applying photolithography using a thin film photoresist for fine pattern and an ArF as a light source. Then, as an extension area ($n^-$) 70, arsenic ion implantation is conducted at 5 keV and $2\times10^{15}$ atoms/cm$^2$ for the memory area and at 5 keV and $6\times10^{14}$ atoms/cm$^2$ for the logic area to conduct fabrication up to a side wall spacer 19 in common to both the memory area and the logic area (FIG. 21). Reference 17 denotes a gate electrode in the completed logic area.

Figure 22:
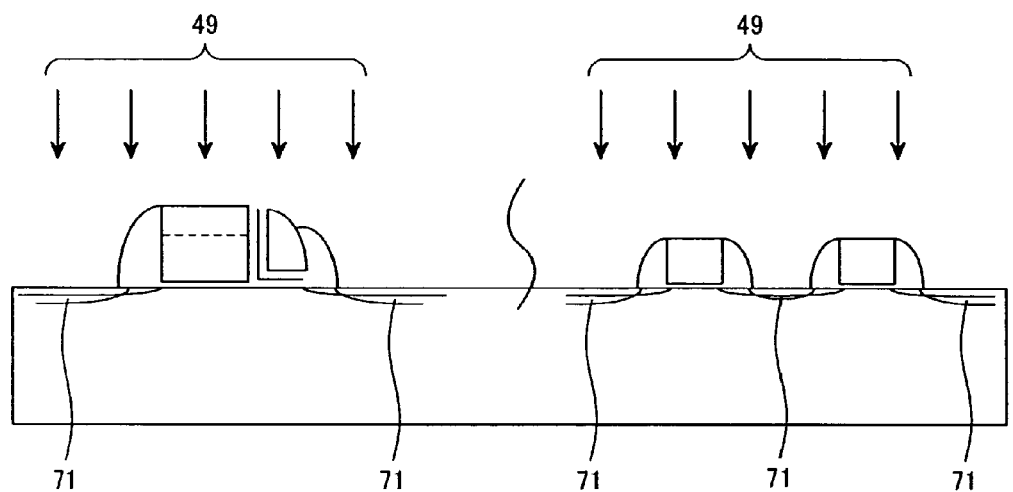
FIG. 22 is a cross sectional view of the semiconductor memory device of the first embodiment illustrating the main portion thereof in the order of manufacturing steps.

After formation of the side wall spacer 19, as a heavily doped diffusion region ($n^+$) 71, arsenic are implanted under the condition at 50 keV and $2\times10^{15}$ atoms/cm$^2$ and phosphorous are implanted at 40 keV and $1\times10^{13}$ atoms/cm$^2$ in common to both the memory area and the logic area (FIG. 22). In the figure, reference 49 denotes implanted ions. In this case, while the ion implantation condition is the deepest for phosphorus, since the height of the side wall electrode 11 in the memory area is sufficiently high (height A), penetration to the channel can be prevented. In this embodiment, the height of the gate electrode in the logic area is B as shown in the figure. Accordingly, a relation, A>B, is established.

Second Embodiment

Figure 23:
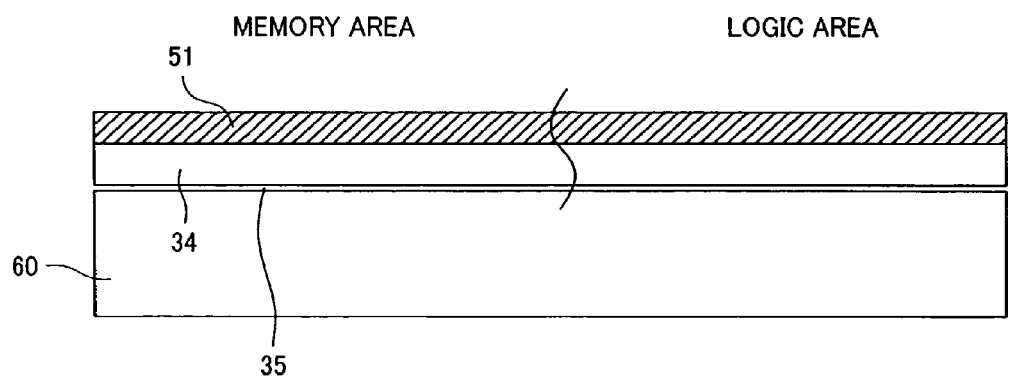
FIG. 23 is a cross sectional view of a semiconductor memory device of a second embodiment illustrating the main portion thereof in the order of manufacturing steps.

A second embodiment is to be described. This embodiment is an example of stacking an oxide layer on a polysilicon layer and controlling the height of the gate electrode in the memory area and the logic area by using the same. The basic structure of the memory cell, the layout, the process rule, etc. are the same as those in the first embodiment. Indication of references in each of FIGS. 23 to 28 is mainly for the illustration of portions having difference in view of the manufacturing step. FIGS. 23 to 28 are cross sectional views of the device of this embodiment shown in the order of manufacturing steps. In each of the figures, the left-hand part is a memory area and the right-hand part is a logic area. This is illustrated in FIG. 23, which is also the same as the other figures in which no particular indications are shown.

As a gate dielectric film shared by a select transistor in a memory area and a transistor in a logic area, a thermal oxidation film 35 of 2 nm in thickness is formed above a semiconductor substrate 60 at 800° C. Successively, a polysilicon film 34 as a gate electrode film is deposited to 150 nm, on which a silicon oxide film 52 is deposited to 100 nm (FIG. 23). The polysilicon film 34 is formed by CVD at a temperature of 640° C. without doping. The silicon oxide film 52 is formed by CVD using monosilane as a source gas at a temperature of 800° C.

Figure 24:
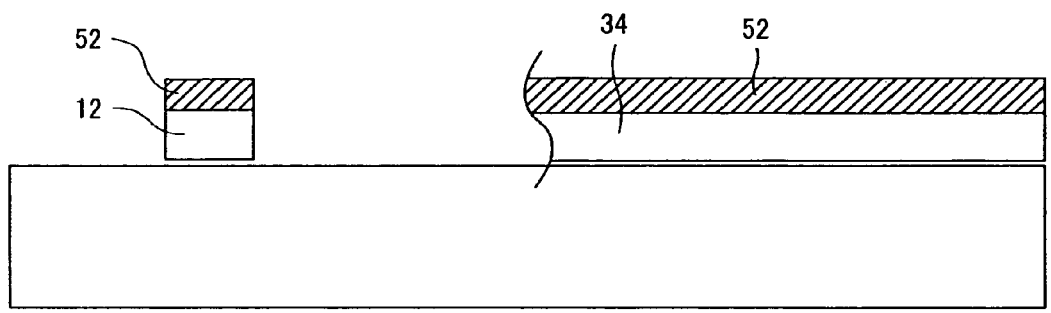
FIG. 24 is a cross sectional view of the semiconductor memory device of the second embodiment illustrating the main portion thereof in the order of manufacturing steps.

Then, a gate electrode pattern is formed by using photolithography and dry etching only for the gate electrode film in the memory area (FIG. 24). In this embodiment the height of the gate electrode 60 is as high as 250 nm. A two-step hard mask process is applied by at first dry etching only the silicon oxide film in the upper layer using a photoresist film as a mask, then removing the photoresist and etching the polysilicon film 34 in the lower layer by using the silicon oxide film 52 as a mask is applied. While the number of steps is increased and it is necessary for optimizing the condition for each of the steps, of a thin film resist can be used also in a case where the gate electrode is as high as 250 nm. Therefore, this method has an advantage that the finest pattern can be fabricated by combination with photolithography using an ArF light source. Thus, the gate length of the select gate electrode can be reduced to 100 nm.

Figure 25:
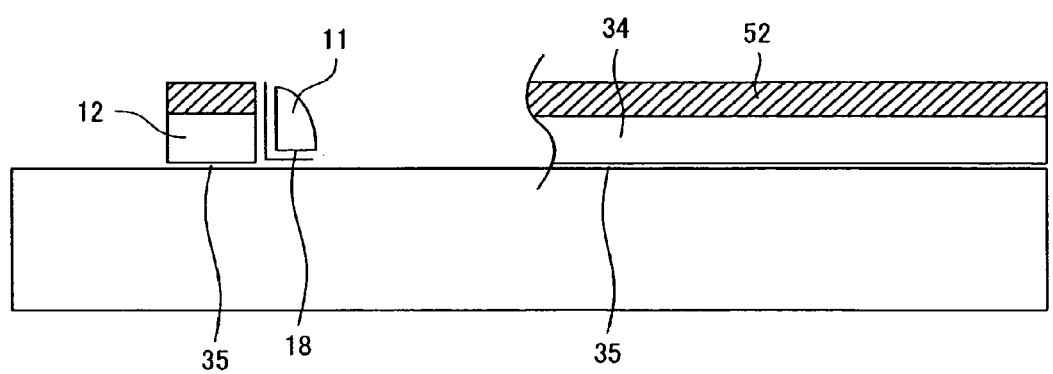
FIG. 25 is a cross sectional view of the semiconductor memory device of the second embodiment illustrating the main portion thereof in the order of manufacturing steps.

Successively, an ONO film 18 comprising three layers of SiO$_2$ film/Si$_3$N$_4$ film/SiO$_2$ film (4 nm/10 nm/6 nm) is deposited as a charge trapping film. Further, a doped amorphous silicon film as a memory gate electrode is deposited to 90 nm thickness. When the amorphous silicon film is etched back by anisotropic dry etching to leave only the side wall gate electrode 11 and removing surplus ONO film with dry and wet etching, a basic memory cell structure is completed (FIG. 25).

Figure 26:
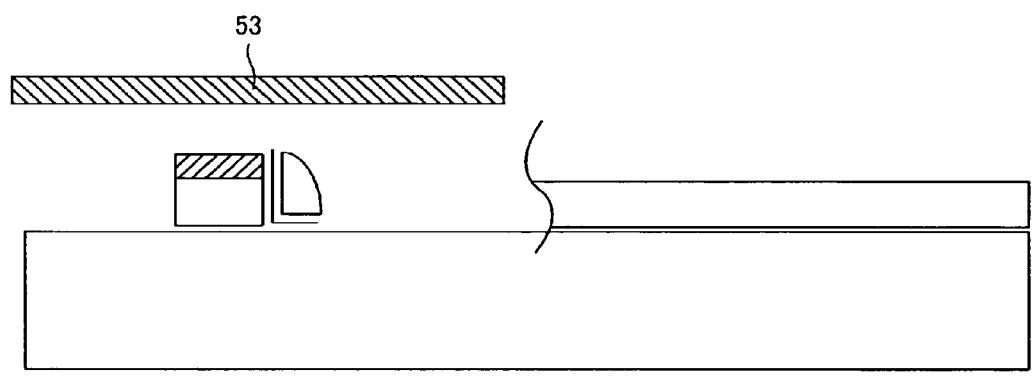
FIG. 26 is a cross sectional view of the semiconductor memory device of the second embodiment illustrating the main portion thereof in the order of manufacturing steps.

Then, a treatment of decreasing the height of the gate electrode film is performed by using photolithography and dry etching only for the gate electrode film in the logic area. While covering the memory cell area with a photoresist film 53, only the silicon oxide layer 52 of 100 nm in thickness in the upper portion of the multilayer structure is removed by selective dry etching of polysilicon (FIG. 26). Since the selectivity between silicon oxide and polysilicon is high enough in the dry etching, the dry etching can be stopped with good controllability at a stage where the second layer 52 is completely removed while preserving the first layer 34. Accordingly, the treatment of decreasing the height can be performed with good uniformity within a wafer.

Figure 27:
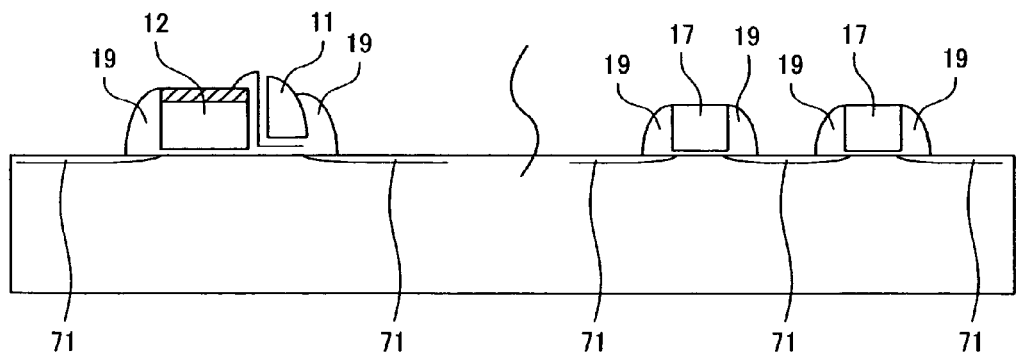
FIG. 27 is a cross sectional view of the semiconductor memory device of the second embodiment illustrating the main portion thereof in the order of manufacturing steps.
Figure 28:
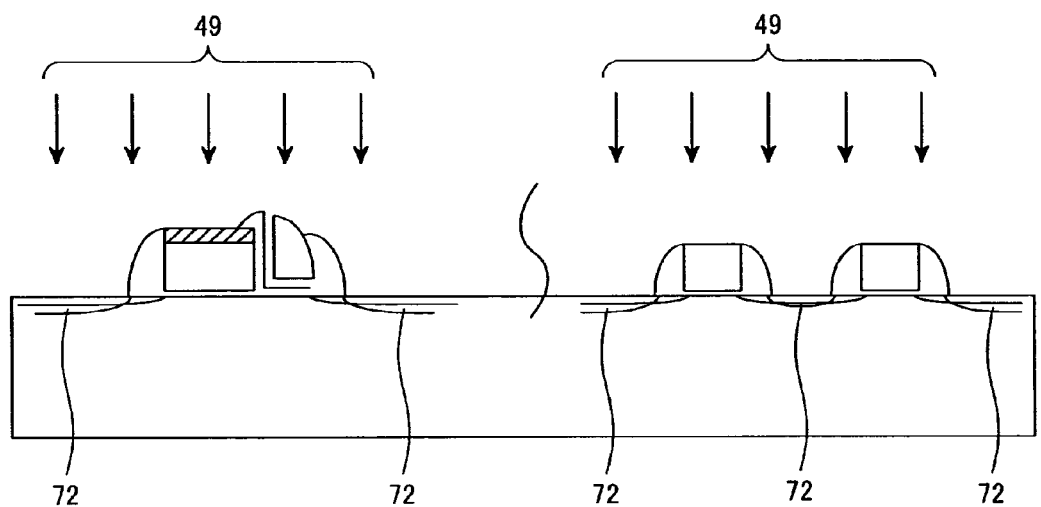
FIG. 28 is a cross sectional view of the semiconductor memory device of the second embodiment illustrating the main portion thereof in the order of manufacturing steps.

Then, a gate electrode pattern in the logic area is formed. In the previous step, the height B of the gate electrode film is decreased to 150 nm. Accordingly, a gate electrode 17 for a high performance transistor with a gate length of 85 nm can be formed by applying photolithography with an ArF light source using a thin photoresist for fine pattern. Then, as an extension area ($n^-$) 70, arsenic ion implantation is performed with arsenic at 5 keV and $2\times10^{15}$ atoms/cm$^2$ for the memory area and at 5 keV and $6\times10^{14}$ atoms/cm$^2$ for the logic area to conduct fabrication up to a side wall spacer 19 in common to both the memory area and the logic area (FIG. 27). After formation of the side wall spacer 19, arsenic are implanted under the condition at 50 keV and $2\times10^{15}$ atoms/cm$^2$ and phosphorous are implanted at 40 keV and $1\times10^{13}$ atoms/cm$^2$ in common to both the memory area and the logic area (FIG. 22). In this case, while the phosphorus ion implantation condition is the deepest, ions penetration to the channel can be prevented since the side wall electrode 11 in the memory area is sufficiently high. In the figure, reference 49 denotes implanted ions.

Third Embodiment

A third embodiment is to be described. This embodiment is an example of stacking a polysilicon layer and a SiGe film and controlling the height of the gate electrode in the memory area and the logic area by using the same. The basic structure of the memory cell, the layout, the process rule, etc. are the same as those in the first embodiment. Differences in the manufacturing steps are to be described with reference to FIGS. 23 to 28, which are cross sectional views for the device shown in the order of the manufacturing steps.

Up to the steps of forming a thermal oxidation film of 2 nm in thickness as a gate dielectric film shared by the select transistor and the transistor in the logic area at 800° C. and, successively, depositing a polysilicon 34 as a gate electrode to 150 nm are the same as those in the first embodiment. This embodiment is different from the first embodiment in that successively a silicon germanium film is deposited to 100 nm. In view of the cross sectional views, they are equal with the form of replacing the silicon oxide film 52 in FIGS. 23 to 28 with a silicon germanium film. The silicon germanium film is formed by CVD. Then, in the same manner as in the first embodiment, a state corresponding to FIG. 25 is obtained by way of the step of forming the select gate electrode pattern, and forming the ONO film and the side wall gate. In the treatment of decreasing the height of the gate electrode film corresponding to FIG. 26, dry etching capable of attaining the selectivity to the silicon germanium film relative to the polysilicon film in the underlayer is used. The succeeding steps are the same as those in Embodiment 1. In a case of using the silicon germanium film for the upper layer of the gate electrode film as shown in this embodiment, since a higher etching selectivity can be attained relative to the polysilicon film in the lower layer, it has an advantage capable of increasing the manufacturing process margin. Further, the silicon germanium film has an effect capable of lowering the resistance when nickel is used for the silicidation. Since the electrode cross sectional area decreases as the scaling is finer and, accordingly, the gate resistance increases, the effect capable of reducing the resistance is improved.

While dry etching is used in the treatment of decreasing the gate electrode height of the silicon germanium film, wet etching can also be used as is well-known in the art.

Fourth Embodiment

Figure 29:
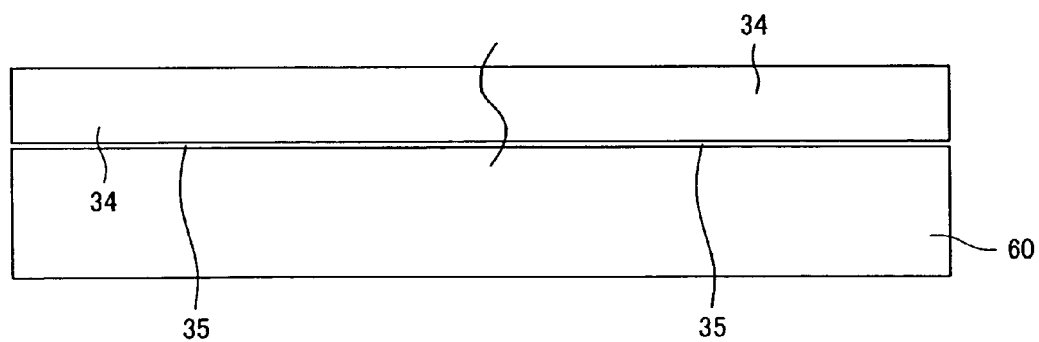
FIG. 29 is a cross sectional view of a semiconductor memory device of a third embodiment illustrating a main part thereof in the order of manufacturing steps.

A fourth embodiment is to be described. This embodiment is an example of controlling the height of the gate electrode in a memory area and a logic area by skillfully considering the etching method for the gate electrode material. The basic structure of the memory cell, the layout, the process rule, etc. are the same as those in the first embodiment. Differences in the manufacturing steps are to be explained with reference to FIGS. 29 to 32. FIGS. 29 to 32 are also cross sectional view of a device shown in the order of manufacturing steps. In each of the drawings, the left-hand part is a memory area and the light-hand part is a logic area. FIG. 29 indicates this, which is also the same as the other drawings where no particular indication is shown.

Figure 30:
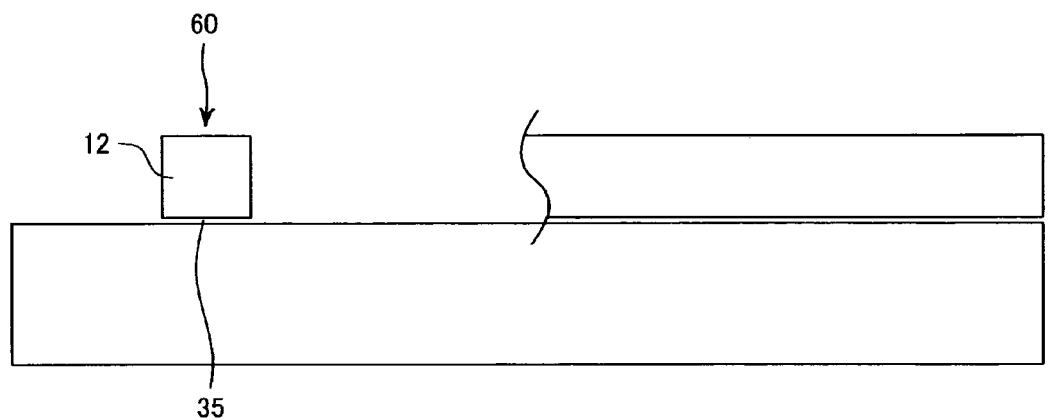
FIG. 30 is a cross sectional view of the semiconductor memory device of the third embodiment illustrating the main part thereof in the order of manufacturing steps.
Figure 31:
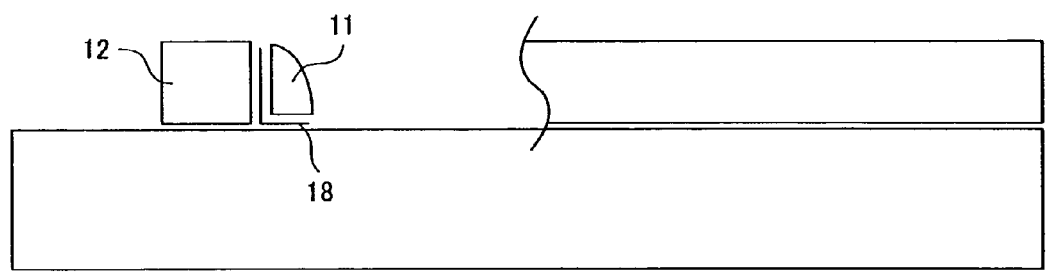
FIG. 31 is a cross sectional view of the semiconductor memory device of the third embodiment illustrating the main part thereof in the order of manufacturing steps.

As a gate dielectric film 35 shared by a select transistor and a transistor in a logic area, a thermal oxide film is grown to 2 nm in thickness at 800° C. on a semiconductor substrate 60 and, successively, a polysilicon 34 as a gate electrode is deposited to 250 nm (FIG. 29). Unlike the first to third embodiments described above, the gate electrode film is not a multilayer structure but a polysilicon single layered structure. The polysilicon 34 is formed at a temperature of 640° C. without doping. Successively, a gate electrode pattern 60 for the memory area is formed in the same manner as in the first embodiment (FIG. 30). Successively, an ONO film 18 comprising three layers of $SiO_2$ film/$Si_3N_4$ film/$SiO_2$ film (4 nm/10 nm/6 nm) is deposited as a charge trapping film and, further, a side wall gate electrode 11 is formed, thus, completing a basic memory cell structure (FIG. 31).

Figure 32:
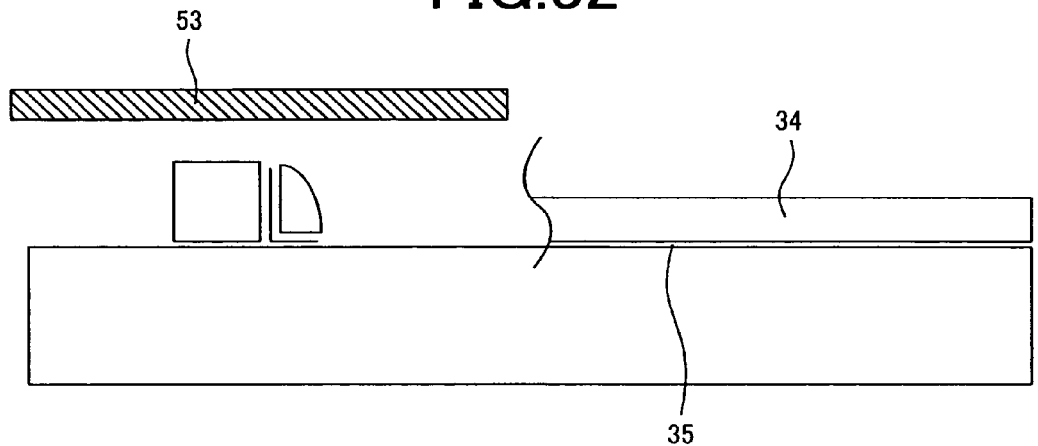
FIG. 32 is a cross sectional view of the semiconductor memory device of the third embodiment illustrating the main part thereof in the order of manufacturing steps.

Successively, dry etching is used to decrease the height of the gage electrode film 34 in the logic area. The thickness of the gate electrode film of 250 nm is decreased to 150 nm (FIG. 32). Succeeding steps are the same as those in the first embodiment. While the method of this embodiment needs a dry etching technique with high accuracy, it has an advantage of simplifying the steps and shortening TAT since the gate electrode film can be deposited in one step.

While dry etching is used in the treatment of decreasing the gate electrode height of the polysilicon film, wet etching can also be used as is well-known in the art.

Fifth Embodiment

Figure 33:
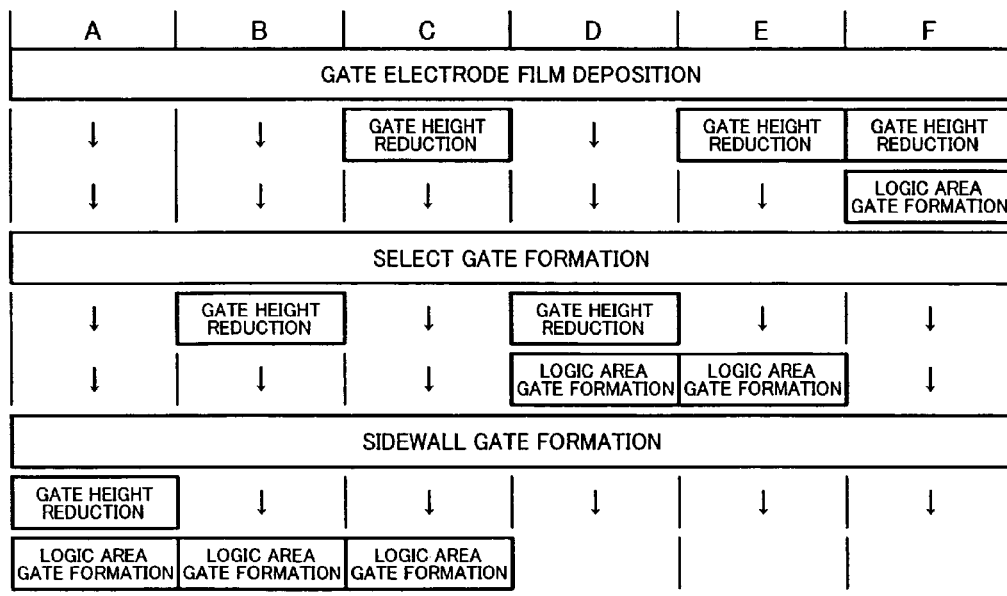
FIG. 33 is an explanatory showing other embodiments.

In the first to fourth embodiments described above, the manufacturing process is performed in the order of depositing the gate electrode film shared by the memory area and the logic area to form the select gate 12, then forming the side wall gate 11 and, successively, decreasing the height of the gate electrode 17 and forming the gate electrode 17 in the logic area. For the step of decreasing the height of the gate electrode and forming the gate electrode in the logic area, the order can be replaced relative to the steps for the memory layer. As shown in FIG. 33, there are six combinations A to F in total. For the memory area, the order of gate electrode film deposition, select gate formation, and side wall gate formation remains unchanged and, also for the logic area, the order of gate height reduction, and gate electrode formation remains unchanged. However, the steps for the respective areas can be combined with each other in plural ways.

For example, the first to fourth embodiments correspond to the combination A in FIG. 33. In the case A, the substrate for the logic area is always protected by the gate electrode film during the memory forming step and, since no problem such as substrate etching occurs, there is an advantage that the performance of the transistor in the logic area can be easily optimized.

The combination B in FIG. 33 may be considered as the fifth embodiment. While the cross sectional view is not illustrated, after formation of the select gate in the memory area, the treatment for decreasing the height of the gate electrode film is conducted only for the logic area. This has an advantage that the substrate for the logic area is protected by the gate electrode against the process for the side wall gate formation in the memory area. Further, this is different from the previous combination A in that since the protective film is the gate electrode material in the logic area, the gate electrode film in the upper layer to be removed by the height reduction treatment has no requirement of protective resistance such as etching selectivity. Accordingly, it has an advantage that a film suitable to height reduction treatment, for example, a silicon oxide film or a silicon germanium film can be applied easily.

The combination C in FIG. 33 may be considered as a sixth embodiment. While the cross sectional view is not illustrated, after deposition of the gate electrode film shared by the memory area and the logic area, the height reduction treatment for the gate electrode film is conducted only for the logic area. This has an advantage that the substrate for the logic area is protected by the gate electrode film to the subsequent process for forming the select gate and the side wall gate. This is similar to but different from the previous combination B in that the substrate for the logic area is protected not only in the side wall formation process for the memory area but also in the select gate formation process. In a case of using a multi-layer structure for the gate electrode film, it has an advantage that the degree of freedom is greatest for the selection of layer to be used for the height reduction in the upper layer.

The combination D in FIG. 33 may be considered as a seventh embodiment. While the cross sectional view is not illustrated, this embodiment adopts the order of forming the select gate for the memory area, then conducting height reduction of the gate electrode film and gate electrode formation in the logic area, and then forming the side wall gate in the memory area. In this case, since the side wall gate formation and the removal of unnecessary side wall gate are conducted equally in both of the select gate in the memory area and the gate in the logic area, this has an advantage capable of unifying the shape such as the amount of substrate etching.

The combination E in FIG. 33 may be considered as an eighth embodiment. While the cross sectional area is not illustrated, after deposition of the gate electrode film shared by the memory area and the logic area, the height reduction treatment of the gate electrode film is conducted only for the logic area in this embodiment. Then, after formation of the select gate in the memory area, the gate electrode in the logic area is formed. While the basic features and advantages are similar to those in the previous combination D, this is different therefrom in that the height reduction treatment for the gate electrode film is conducted before select gate formation in the memory area. Accordingly, in a case, for example, of using a multilayer structure for the gate electrode film, etc., this has an advantage that the film in the upper layer requires no protection resistance to process such as etching or cleaning upon formation of the selected gate electrode, and a film suitable to the height reduction treatment, for example, a silicon oxide film or a silicon germanium film can be applied easily.

The combination F in FIG. 33 may be considered as a ninth embodiment. While the cross sectional view is not illustrated, after deposition of the gate electrode film shared by the memory area and logic area, the height reduction treatment and gate electrode formation for the gate electrode film are conducted only for the logic area. One of the most prominent features is that the gate in the logic area is formed prior to the select gate formation in the memory area, and the order is adopted only in this embodiment. For example, in a case of intending ion implantation to the diffusion region (extension) only for the gate in the logic area in self-alignment manner using the gate as the mask, since the memory area is entirely covered with the select gate electrode film, this has an advantage that ion implantation can be conducted with no requirement for the mask.

As described above, there are a plurality of technical options regarding the height reduction of the gate electrode film as to the use of a multilayer or a single layered structure, the method therefor, as well as how to combine the steps of height reduction of the gate electrode film and the gate formation in the logic area with the order of the steps of the gate electrode film deposition, select gate formation, and the side wall gate formation in the memory area, and the sequence thereof. It will be apparent that the intended effect can be obtained also by a simple combination not described herein for plural methods of height reduction treatment for gate electrode films and plural orders of steps for the memory area and logic area.

As has been described above, the present invention can overcome the problem of penetration of implanted ions due to the difference with respect to the optimal gate height caused upon simultaneous formation of a self-align split gate type memory cell utilizing the side wall structure and a scaled MOS transistor. As a result, a gate electrode structure optimized for the memory cell and a gate electrode structure optimized for higher performance CMOS in the logic area can be compatible on one substrate. This can provide high performance and high functional non-volatile memory embedded logic products.

DESCRIPTION OF REFERENCE NUMERALS

1: source diffusion region,
2: memory gate line,
3: select gate line,
4: bit line,
5: drain diffusion region,
6: select gate oxide film,
11: memory gate electrode,
12: select gate electrode,
13: bottom oxide film,
14: silicon nitride film,
15: top oxide film,
16: silicided portion,
17: gate electrode in logic area,
18: diffusion region in logic area,
18: ONO film
19: oxide film side wall,
20: memory gate electrode material (amorphous silicon),
21: contact,
27: silicide portion,
31: unit memory area,
32: silicon substrate,
33: device isolation area,
34: gate electrode material (polysilicon),
40: side wall in the memory gate area to be removed subsequently,
42: dielectric film,
49: implanted ion,
50: penetration of implanted ions to a channel,
51: native oxide film,
52: silicon oxide film,
53: photoresist.

What is claimed is:

1. A method of manufacturing a semiconductor device in which a non-volatile memory cell is formed in a memory cell region and a MOS transistor is formed in a logic region, the method comprising the steps;
   (a) forming a first gate dielectric film over a semiconductor substrate;
   (b) forming a first conductive film over the first gate dielectric film;
   (c) forming a first dielectric film over the first conductive film;
   (d) forming a select gate comprising a multilayer of the first conductive film and the first dielectric film by patterning the first conductive film and the first dielectric film in the memory cell region;
   (e) after the step (d), forming a second gate dielectric film including a charge trapping film over the semiconductor substrate;
   (f) forming a second conductive film over the second gate dielectric film;
   (g) forming a memory gate of the non-volatile memory cell formed on a side of the select gate by etching the second conductive film using an anisotropic etching and removing the second conductive film in the logic region, the select gate formed as a side wall structure;
   (h) forming a gate electrode of the MOS transistor comprising the first conductive film by patterning the first conductive film in the logic region; and
   (i) forming a first impurity region of the memory cell and a second impurity region of the MOS transistor over the semiconductor by using an ion implantation,
   wherein the first dielectric film formed over the logic region is removed prior to the step (h).

2. The method of manufacturing a semiconductor device according to claim 1,
   wherein the step (i) comprises the steps:
   (i1) forming a first impurity region with low concentration aligned with the memory gate and a second impurity region with low concentration aligned with the third gate electrode using an ion implantation;
   (i2) after the step (i1), forming a first sidewall spacer comprising a second dielectric film on the side of the memory and a second sidewall spacer comprising a second dielectric film on the side of the third gate electrode; and
   (i3) using ion implantation, in the semiconductor substrate, forming a first impurity region with a high concentration electrically connected to the first impurity region with a low concentration, and a second impurity region with a high concentration electrically connected to the second impurity region with a low concentration, the first impurity region with a high concentration being aligned with the first sidewall spacer and the second impurity region with a high concentration being aligned with the second sidewall spacer.

3. The method of manufacturing a semiconductor device according to claim 1, further comprising:
- in the step (i1), forming a third impurity region with low concentration aligned with the select gate in the semiconductor substrate;
- in the step (i2), forming a third sidewall spacer comprising the second dielectric film on the side of the select gate; and
- in the step (i3), forming a third impurity region with high concentration electrically connected to the third impurity region with low concentration aligned with the third sidewall spacer in the semiconductor substrate.

4. The method of manufacturing a semiconductor device according to claim 1,
wherein the charge trapping film is a silicon nitride film.

\* \* \* \* \*